(12) United States Patent
Lee et al.

(10) Patent No.: US 9,570,709 B2
(45) Date of Patent: Feb. 14, 2017

(54) METHOD FOR MANUFACTURING ULTRATHIN ORGANIC LIGHT-EMITTING DEVICE

(71) Applicant: Corning Precision Materials Co., Ltd., Chungcheongnam-do (KR)

(72) Inventors: Joo Young Lee, Chungcheongnam-do (KR); Eun Ho Choi, Chungcheongnam-do (KR); Hyun Hee Lee, Chungcheongnam-do (KR)

(73) Assignee: Corning Precision Materials Co., Ltd. (KR)

( * ) Notice: Subject to any disclaimer, the term of this patent is extended or adjusted under 35 U.S.C. 154(b) by 0 days.

(21) Appl. No.: 14/905,616

(22) PCT Filed: Jul. 16, 2014

(86) PCT No.: PCT/KR2014/006446
§ 371 (c)(1),
(2) Date: Jan. 15, 2016

(87) PCT Pub. No.: WO2015/009059
PCT Pub. Date: Jan. 22, 2015

(65) Prior Publication Data
US 2016/0172629 A1    Jun. 16, 2016

(30) Foreign Application Priority Data
Jul. 16, 2013  (KR) .................. 10-2013-0083658

(51) Int. Cl.
*H01L 21/00*    (2006.01)
*H01L 51/52*    (2006.01)
(Continued)

(52) U.S. Cl.
CPC ....... *H01L 51/5268* (2013.01); *H01L 51/0034* (2013.01); *H01L 51/0035* (2013.01);
(Continued)

(58) Field of Classification Search
CPC ............. H01L 51/0034; H01L 51/0035; H01L 51/0094; H01L 51/0096; H01L 51/50; H01L 51/5246; H01L 51/5268; H01L 51/56; H01L 2251/303; H01L 2251/558; Y02E 10/549; Y02E 70/521
See application file for complete search history.

(56) References Cited

U.S. PATENT DOCUMENTS

2010/0178478 A1   7/2010  Bae et al.
2012/0061881 A1   3/2012  Bae et al.
(Continued)

FOREIGN PATENT DOCUMENTS

JP   2012206382 A   10/2012
KR   20070051601 A   5/2007
(Continued)

OTHER PUBLICATIONS

International Search Report for Application No. PCT/KR2014/006446 dated Oct. 21, 2014.

*Primary Examiner* — Thanh T Nguyen
(74) *Attorney, Agent, or Firm* — Lerner, David, Littenberg, Krumholz & Mentlik, LLP

(57) ABSTRACT

The present invention relates to a method for manufacturing an ultrathin organic light-emitting device and, more specifically, to a method for manufacturing an ultrathin organic light-emitting device capable of dramatically reducing the thickness thereof, in addition to improving light extraction efficiency. To this end, the present invention provides a method for manufacturing an ultrathin organic light-emitting device, comprising: a polymer material coating step for coating a polymer material onto a support; a frit coating step for coating a frit paste onto the polymer material; a heat treatment and separation step for conducting heat treatment at a temperature at which the polymer material breaks down, (Continued)

thereby separating the support and a frit substrate which has been formed by heat-treating the frit paste; and a device layer forming step for forming, in sequence, a device layer comprising a first electrode, a device layer comprising an organic light-emitting layer, and a device layer comprising a second electrode, on one side of the frit substrate which has been in contact with the polymer material.

14 Claims, 5 Drawing Sheets

(51) Int. Cl.
H01L 51/00 (2006.01)
H01L 51/56 (2006.01)
H01L 51/50 (2006.01)

(52) U.S. Cl.
CPC ...... *H01L 51/0094* (2013.01); *H01L 51/0096* (2013.01); *H01L 51/5246* (2013.01); *H01L 51/56* (2013.01); *H01L 51/50* (2013.01); *H01L 2251/303* (2013.01); *H01L 2251/558* (2013.01); *Y02E 10/549* (2013.01); *Y02P 70/521* (2015.11)

(56) References Cited

U.S. PATENT DOCUMENTS

| 2012/0147297 | A1* | 6/2012 | Kim | G06F 1/1616 |
| | | | | 349/86 |
| 2012/0153275 | A1* | 6/2012 | Endo | H01L 27/1225 |
| | | | | 257/43 |
| 2014/0234583 | A1 | 8/2014 | Ryu et al. | |

FOREIGN PATENT DOCUMENTS

| KR | 20100083697 A | 7/2010 |
| KR | 20120027632 A | 3/2012 |
| KR | 20130009704 A | 1/2013 |

* cited by examiner

FIG. 7
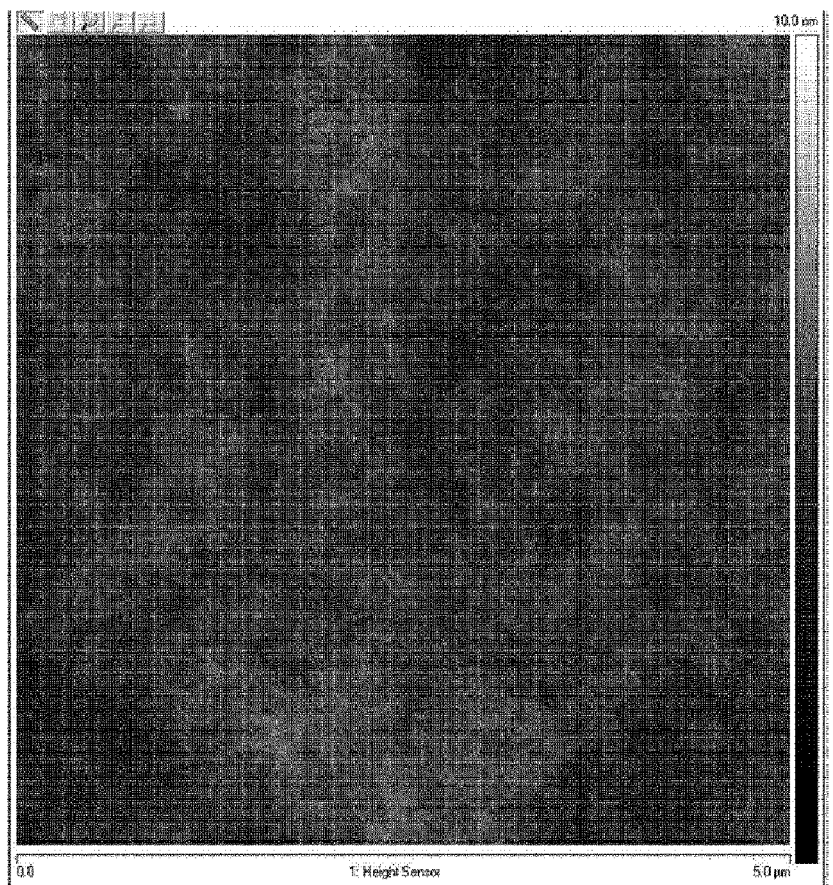
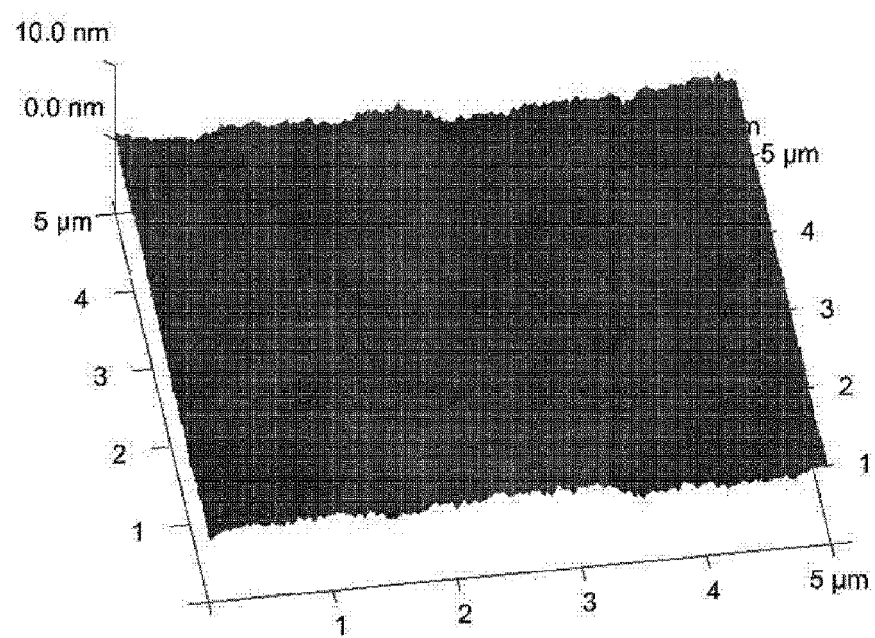

METHOD FOR MANUFACTURING ULTRATHIN ORGANIC LIGHT-EMITTING DEVICE

CROSS REFERENCE TO RELATED APPLICATIONS

The present application is a national phase entry under 35 U.S.C. §371 of International Application No. PCT/KR2014/006446, filed Jul. 16, 2014, which claims priority from Korean Application No. 10-2013-0083658, filed Jul. 16, 2013, all of which are incorporated herein by reference.

BACKGROUND OF THE INVENTION

Field of the Invention

The present invention relates to a method for manufacturing an ultrathin organic light-emitting device, and more particularly, to a method for manufacturing an ultrathin organic light-emitting device, of which the light extraction efficiency can be improved and the thickness can be significantly reduced.

Description of Related Art

In general, light-emitting devices can be generally divided into organic light-emitting devices in which a light-emitting layer is made of an organic matter and inorganic light-emitting devices in which a light-emitting layer is made of an inorganic matter. In these light-emitting devices, the light-emitting layer is a self light-emitting layer which generates light using energy emitted from excitons that are generated through the recombination of electrons injected through a cathode and holes injected through an anode. Such organic light-emitting devices have a variety of advantages, such as, low-voltage driving, self-emission, a wide viewing angle, a high resolution, natural color reproduction and rapid response.

Recently, active studies are underway in order to apply organic light-emitting devices to a variety of devices, such as portable information devices, cameras, watches, office equipment, information display windows of vehicles, televisions (TVs), displays, or illumination systems.

Approaches for improving the luminous efficiency of organic light-emitting devices include an approach of improving the luminous efficiency of a material that constitutes a light-emitting layer and an approach of improving the light extraction efficiency at which light generated from the light-emitting layer is extracted.

The light extraction efficiency depends on the refractive indices of layers which form an organic light-emitting device. In a typical organic light-emitting device, when a ray of light generated from the light-emitting layer is emitted at an angle greater than a critical angle, the ray of light is totally reflected at the interface between a higher-refractivity layer, such as a transparent electrode layer, and a lower-refractivity layer, such as a glass substrate. This consequently lowers the light extraction efficiency, thereby lowering the overall luminous efficiency of the organic light-emitting device, which is problematic.

More specifically, only about 20% of light generated from the light-emitting layer is emitted to the outside and about 80% of the light is lost by a waveguide effect originating from the difference in the refractive index between the light-emitting layer which includes an electron injection layer, an electron transport layer, an emissive layer, a hole transport layer, and hole injection layer, and an anode, and a glass substrate, as well as by a total internal reflection originating from the difference in the refractive index between the glass substrate and the air. Here, the refractive index of the internal organic light-emitting layer ranges from 1.7 to 1.8, whereas the refractive index of indium tin oxide (ITO) which is generally used for the anode is about 1.9. Since the two layers have a very small thickness ranging from 200 to 400 nm and the refractive index of glass used for the glass substrate is about 1.5, a planar waveguide is thereby caused inside the organic light-emitting device. It is calculated that the ratio of the light lost in the internal waveguide mode due to the above-described reason is about 45%. In addition, since the refractive index of the glass substrate is about 1.5 and the refractive index of the ambient air is 1.0, when the light is directed outward from the inside of the glass substrate, a ray of the light having an angle of incidence greater than a critical angle is totally reflected and is trapped inside the glass substrate. The ratio of the trapped light is up to about 35%, and only about 20% of the generated light is emitted to the outside.

The organic light-emitting device is gaining increasing interest due to its slim profile that is thinner than those of the other light-emitting devices, such as light-emitting diodes (LEDs). Since the self-emitting organic light-emitting device does not require a backlight unit (BLU) to be added thereto, the organic light-emitting device advantageously allows a final product with a thickness of several millimeters. However, although it is desired to further reduce the thickness of the organic light-emitting device, it is impossible to further reduce the thickness of the organic light-emitting device based on the existing structure or process, since there is a limit in reducing the thickness of a glass substrate or an encapsulation glass substrate of the organic light-emitting device. When the organic light-emitting device is fabricated under the existing process, the minimum thickness of the glass substrate is 0.1 mm. When the organic light-emitting device is fabricated based on the existing process, the thickness of the organic light-emitting device must be greater than the thickness of the glass substrate.

The information disclosed in the Background of the Invention section is provided only for better understanding of the background of the invention and should not be taken as an acknowledgment or any form of suggestion that this information forms a prior art that would already be known to a person skilled in the art.

RELATED ART DOCUMENT

Patent Document 1: Korean Patent Application Publication No. 10-2007-0051601 (May 18, 2007)

BRIEF SUMMARY OF THE INVENTION

Various aspects of the present invention provide a method of manufacturing an ultrathin organic light-emitting device, of which the light extraction efficiency can be improved and the thickness can be significantly reduced.

In an aspect of the present invention, provided is a method of manufacturing an ultrathin organic light-emitting device. The method includes the following steps of: coating a support with a polymeric material; coating the polymeric material with frit paste; heat-treating a resultant structure at a temperature where the polymeric material decomposes such that a frit substrate formed from the frit paste by the heat treatment is separated from the support; and forming a device layer on one surface of the frit substrate which has coated the polymeric material, the device layer including a first electrode, an organic light-emitting layer and a second electrode which are sequentially disposed on the one surface of the frit substrate.

According to an embodiment of the present invention, the polymeric material may be coated with the frit paste such that the thickness of the frit substrate ranges from 4 to 5 μm.

The polymeric material coating the support may be one selected from the group of candidate polymeric materials consisting of polydimethylsiloxane (PDMS), photoresist (PR) and polyimide (PI).

The temperature where the resultant structure is heat-treated may range from 400 to 600° C.

After the frit substrate is separated from the support, the surface roughness of the other surface of the frit substrate may be higher than the surface roughness of the one surface of the frit substrate on which the device layer will be formed.

The surface roughness of the one surface of the frit substrate may range from 0.4 to 0.5 nm.

The total of the thickness of the frit substrate and the thickness of the device layer may be 10 μm or less.

In another aspect of the present invention, provided is a method of manufacturing an ultrathin organic light-emitting device. The method includes the following steps of: coating a support with a polymeric material; coating the polymeric material with a metal oxide that contains light-scattering particles therein; coating the metal oxide with frit paste; heat-treating a resultant structure at a temperature where the polymeric material decomposes such that a stack including a frit substrate formed from the frit paste by the heat treatment and the metal oxide is separated from the support; and forming a device layer on one surface of the stack which has coated the polymeric material, the device layer including a first electrode, an organic light-emitting layer and a second electrode which are sequentially disposed on the one surface of the metal oxide.

According to an embodiment of the present invention, the polymeric material may be coated with the metal oxide and the frit paste such that the thickness of the stack ranges from 5 to 20 μm.

The polymeric material coating the support may be one selected from the group of candidate polymeric materials consisting of polydimethylsiloxane (PDMS), photoresist (PR) and polyimide (PI).

The temperature where the resultant structure may be heat-treated ranges from 400 to 600° C.

After the stack is separated from the support, the surface roughness of the other surface of the stack may be higher than the surface roughness of the one surface of the stack on which the device layer will be formed.

The surface roughness of the one surface of the metal oxide may range from 0.4 to 0.5 nm.

As set forth above, the present invention utilizes the characteristics of a polymer that decomposes at a high temperature and forms a highly flat surface through coating. An ultrathin frit substrate that can substitute for a conventional glass substrate is produced by coating a support with a polymeric material, coating the polymeric material with a frit at an intended thickness, and then firing the resultant structure at a temperature where the polymeric material decomposes, thereby the hardened frit or a frit substrate being separated from the support. Owing to one characteristic of the polymeric material that forms a highly flat surface, one surface of the frit substrate that has coated the polymeric material also forms a highly flat surface, which will adjoin a transparent electrode that must have a high level of flatness, thereby precluding the necessity of a separate planarization layer. Since the other surface of the frit substrate has a high level of surface roughness, a separate external light extraction layer is not required. An internal light extraction layer can also be omitted since the frit substrate has a high refractive index, which is equal or similar to a transparent electrode. According to the present invention, the frit substrate can substitute for a glass substrate and internal and external light extraction layers of a conventional organic light-emitting device, whereby the thickness of an organic light-emitting device can be minimized. That is, it is possible to fabricate an organic light-emitting device, the thickness of which is about $\frac{1}{10}^{th}$ of a conventional organic light-emitting device, while improving the light extraction efficiency of the organic light-emitting device.

In addition, a stack including an internal light extraction layer and a frit substrate can be produced by coating the polymeric material with a metal oxide that contains light-scattering particles therein before the frit coating. It is therefore possible to further improve the light extraction efficiency of the organic light-emitting device. Here, the surface of the internal light extraction layer that will adjoin the transparent electrode after separated from the support forms a highly flat surface.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

BRIEF DESCRIPTION OF THE DRAWINGS

FIG. 7 is AFM pictures showing the surface roughness of a layer of PDMS, one of a coating polymeric material used in the method of manufacturing an ultrathin organic light-emitting device according to the exemplary embodiment of the present invention;

DETAILED DESCRIPTION OF THE INVENTION

Figure 1:
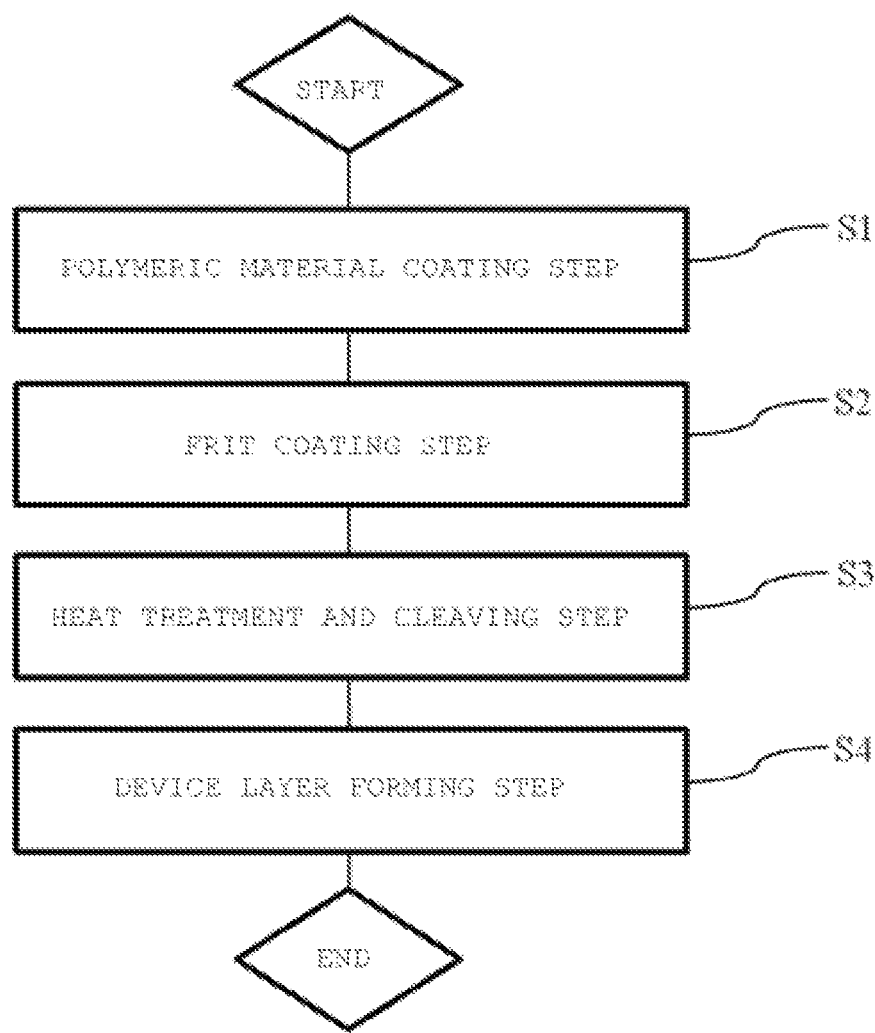
FIG. 1 is a process flowchart showing a method of manufacturing an ultrathin organic light-emitting device according to an exemplary embodiment of the present invention.

Reference will now be made in detail to a method of manufacturing an ultrathin organic light-emitting device according to the present invention, embodiments of which are illustrated in the accompanying drawings and described below, so that a person skilled in the art to which the present invention relates can easily put the present invention into practice.

Throughout this document, reference should be made to the drawings, in which the same reference numerals and signs are used throughout the different drawings to designate the same or similar components. In the following description of the present invention, detailed descriptions of known functions and components incorporated herein will be omitted when they may make the subject matter of the present invention unclear.

As shown in FIG. 1, the method of manufacturing an ultrathin organic light-emitting device according to this exemplary embodiment includes a polymeric material coating step S1, a frit coating step S2, a heat treatment and separating step S3 and a device layer forming step S4.

Figure 2:
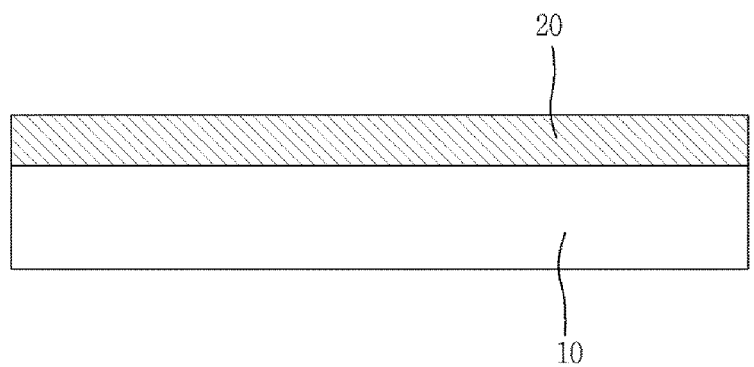
FIG. 2 to FIG. 6 are schematic views sequentially showing the processes of the method of manufacturing an ultrathin organic light-emitting device according to the exemplary embodiment of the present invention.

First, as shown in FIG. 2, the polymeric material coating step S1 is carried out by coating a support 10 with a polymeric material 20. At the polymeric material coating step S1, the polymeric material 20 can be one selected from among candidate polymeric materials including, but not limited to, polydimethylsiloxane (PDMS), photoresist (PR) and polyimide (PI). The polymeric material 20 is characterized in that it decomposes at a high temperature. In addition, as shown in atomic force microscopy (AFM) pictures in FIG. 7, when the polymeric material 20 is PDMS, the polymeric material 20 coating the support 10 forms a highly flat surface that has a maximum surface roughness Rpv of 4.33 nm and an average surface roughness rms of 0.42 nm. Owing to these characteristics of the polymeric material 20 according to this exemplary embodiment, a frit substrate (110 in FIG. 5) that is to be formed in the following process can have a highly flat surface like the polymeric material 20. This will be described in greater detail later.

At the polymeric material coating step S1, the support 10 that is to be coated with the polymeric material 20 may be a substrate such as a piece of glass or a wafer.

Figure 3:
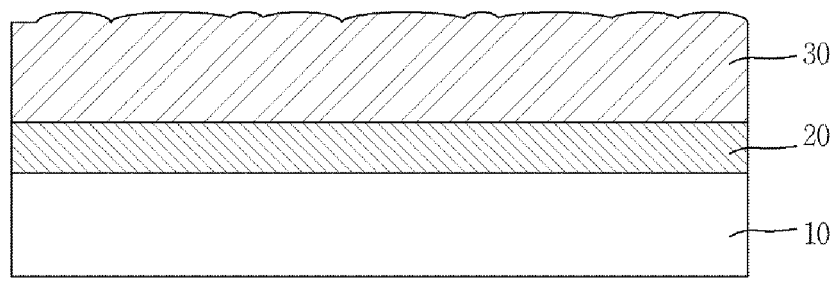

Afterwards, as shown in FIG. 3, the frit coating step S2 is carried out by coating the polymeric material 20 with frit paste 30. The frit paste 30 can be prepared by mixing frit powder into an organic solvent to which an organic binder is added. The frit paste 30 that coats the polymeric material 20 in this manner will be fired during the following heat treatment process, thereby forming the frit substrate (110 in FIG. 5). The frit substrate (110 in FIG. 5) formed in this manner substitutes for a conventional glass substrate that is formed with a thickness of about 100 μm. Since the frit substrate (110 in FIG. 5) is formed by coating with the frit paste 30, it is possible to form the frit substrate (110 in FIG. 5) with a thickness of about several micrometers, whereby an ultrathin organic light-emitting device (100 in FIG. 6) can be fabricated. Therefore, at the frit coating step S2, it is preferred that the polymeric material 20 be coated with the frit paste 30 in consideration of shrinkage during the heat treatment process such that the thickness of the frit substrate (110 in FIG. 5) formed by firing will range from 4 to 5 μm.

Figure 4:
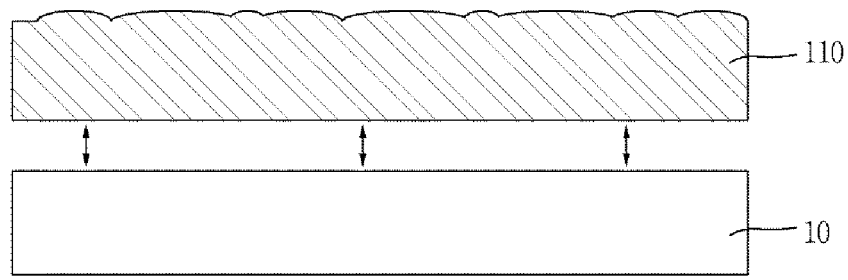
Figure 5:

In FIG. 4 and FIG. 5, the heat treatment and separating step S3 is intended to decompose the polymeric material 20 through heat treatment, whereby the frit substrate 110 formed from the frit paste 30 through the heat treatment is separated from the support 10. At the heat treatment and separating step S3, the heat treatment is carried out at a temperature where the polymeric material 20 decomposes. For example, the heat treatment can be carried out at a temperature ranging from 400 to 600° C.

When the heat treatment is carried out at the temperature where the polymeric material 20 decomposes, the polymeric material 20 is removed through the decomposition, whereby the frit substrate 110 is separated from the support 10. Since the polymeric material 20 forms the highly flat surface when the polymeric material 20 is applied on the support 10, one surface of the frit paste 30 that has coated the highly flat surface of the polymeric material 20 also forms a highly flat surface. In other words, one surface of the frit substrate 110 that is made through the heat treatment forms a highly flat surface. Consequently, without addition of a planarization layer, one surface of the frit substrate 110 that is highly flat can adjoin a first electrode (121 in FIG. 6) of a device layer (120 in FIG. 6) that must have a high level of flatness. Since one surface of the frit substrate 110 is the highly flat surface, the frit substrate 110 can serve as a base substrate on which the device layer (120 in FIG. 6) is to be deposited. Here, the surface roughness rms of the one surface of the frit substrate 110 which has coated the polymeric material 20 ranges from 0.4 to 0.5 nm, which is similar or equal to the surface roughness of the polymeric material 20. In addition, since a refractive index of the frit substrate 110 is similar or equal to that of the transparent first electrode (121 in FIG. 6), a conventional internal light extraction layer can be omitted.

In the frit substrate 110, the surface roughness of the other surface is higher than the surface roughness of the one surface. The one surface of the frit substrate 110 adjoins the device layer (120 in FIG. 6), and the other surface of the frit substrate 110 is exposed to the outside. The high surface roughness of the surface that is exposed to the outside indicates that protrusions/depressions are formed on that surface. These protrusions/depressions form a structure that is similar to a conventional lens array which is formed on the outer surface of a glass substrate in order to improve light extraction efficiency, thereby contributing to an improvement in the light extraction efficiency of the organic light-emitting device (100 in FIG. 6).

In this manner, the frit substrate 110 is produced based on the thermal decomposition and planarization characteristics of the polymeric material 20. The frit substrate 110 serves as a glass substrate, an internal light extraction layer and an external light extraction layer of an organic light-emitting device. Consequently, the organic light-emitting device (100 in FIG. 6) can have an ultrathin profile, the thickness of which is about $\frac{1}{10}^{th}$ of a conventional organic light-emitting device.

Figure 6:
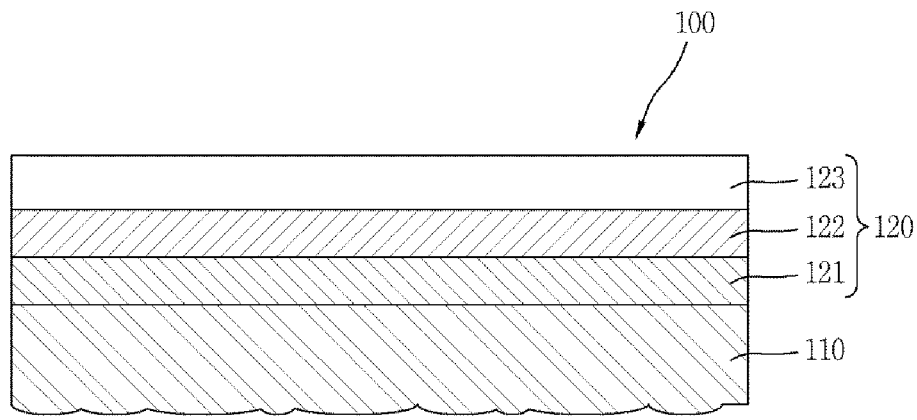

Afterwards, as shown in FIG. 6, the device layer forming step S4 is carried out by forming the device layer 120 on the one surface of the frit substrate 110, or the highly flat surface, which has coated the polymeric material 20. At the device layer forming step S4, components of the device layer 120 including the first electrode 121, an organic light-emitting layer 122 and a second electrode 123 are sequentially formed on the one surface of the frit substrate 110. The first electrode 121 serves as the anode of the organic light-emitting device 100. The first electrode 121 can be made of a metal or metal oxide, for example, Au, In, Sn or indium tin oxide (ITO), which has a significant work function in order to facilitate the hole injection. The organic light-emitting layer 122 can include a hole injection layer, a hole transport layer, an emissive layer, an electron transport layer and an electron injection layer which are sequentially stacked on the first electrode 121. An organic light-emitting device 100 fabricated according to another exemplary embodiment can have a tandem structure. Specifically, a plurality of organic light-emitting layers can alternate with interconnecting layers. The second electrode 123 can be made of a metal thin film of, for example, Al, Al:Li or Mg:Ag, which has a smaller work function in order to facilitate the electron injection. The thickness of the device layer 120 formed in this manner can be 4 μm or less.

After the device layer forming step S4 is completed, it is possible to dispose a piece of encapsulation glass plate (not shown) on the device layer 120 such that the encapsulation glass plate (not shown) faces the frit substrate 110 and then provide seals made of epoxy on the circumference of the frit substrate 110 and the circumference of the encapsulation glass plate (not shown) in order to protect the device layer 120 from the external environment.

The organic light-emitting device 100 fabricated by the above-described processes can have an ultra-thin profile, the thickness of which is about $\frac{1}{10}^{th}$ of a conventional organic light-emitting device. Specifically, according to this exemplary embodiment, the frit substrate 110 can be made of the frit paste instead of a conventional glass substrate. While there is a limit in reducing the thickness of the glass substrate, the thickness of the frit paste can be adjusted through the coating. In this manner, the thickness of the frit substrate 110 can be reduced while the thickness of the device layer 120 stays fixed. In addition, the frit substrate 110 serves as internal and external light extraction layers, thereby precluding the necessity of forming the internal and external light extraction layers on the front and rear surfaces of the substrate as in the related art. It is therefore possible to significantly reduce the overall thickness of the organic light-emitting device 100 and realize superior light extraction efficiency of the organic light-emitting device 100.

A description will be given below of a method of manufacturing an ultrathin organic light-emitting device according to another exemplary embodiment of the present invention with reference to FIG. 8 to FIG. 11.

Figure 8:
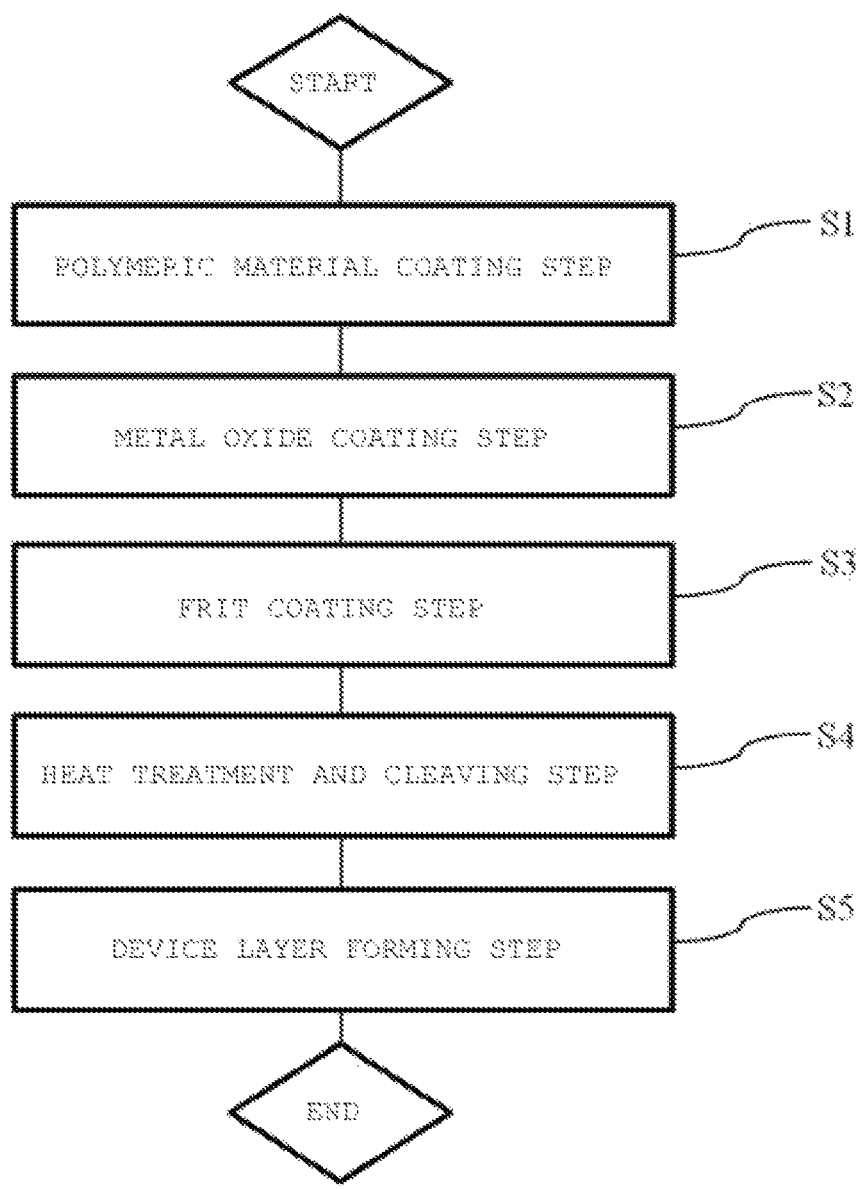
FIG. 8 is a process flowchart showing a method of manufacturing an ultrathin organic light-emitting device according to another exemplary embodiment of the present invention.
Figure 9:
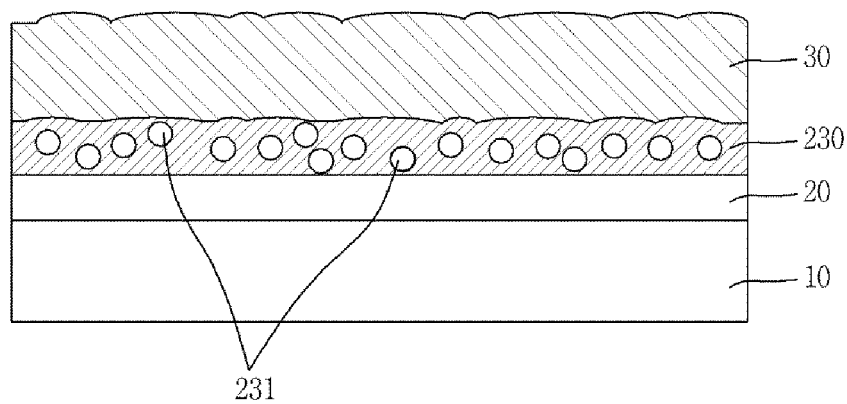
FIG. 9 to FIG. 11 are schematic views sequentially showing the processes of the method of manufacturing an ultrathin organic light-emitting device according to the another exemplary embodiment of the present invention.
Figure 10:
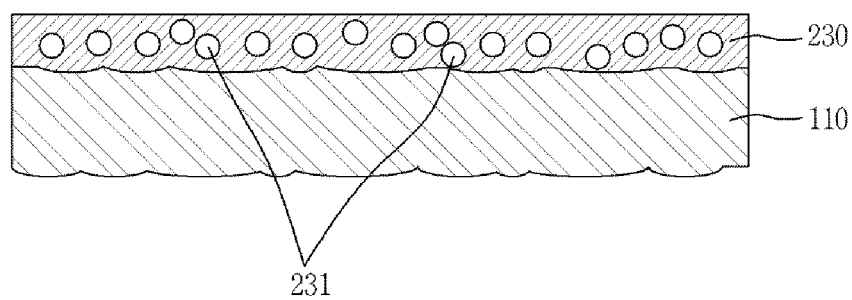
Figure 11:
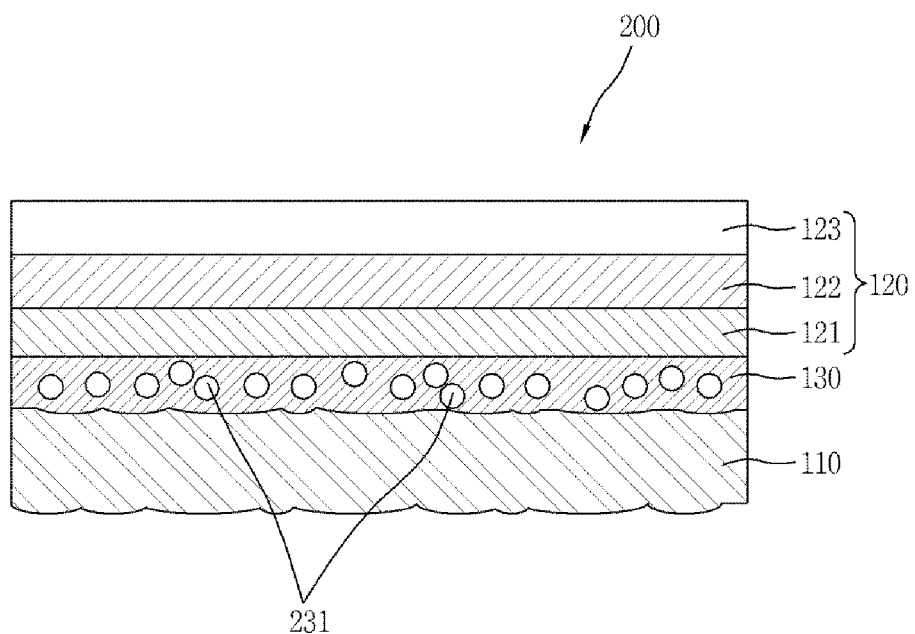

FIG. 8 is a process flowchart showing a method of manufacturing an ultrathin organic light-emitting device according to the another exemplary embodiment of the present invention, and FIG. 9 to FIG. 11 are schematic views sequentially showing the processes of the method of manufacturing an ultrathin organic light-emitting device according to the another exemplary embodiment of the present invention.

As shown in FIG. 8, the method of manufacturing an ultrathin organic light-emitting device according to this exemplary embodiment includes a polymeric material coating step S1, a metal oxide coating step S2, a frit coating step S3, a heat treatment and separating step S4 and a device layer forming step S5.

First, as shown in FIG. 9, the polymeric material coating step S1 is carried out by coating a support 10 with a polymeric material 20. A description of the polymeric material coating step S1 according to this embodiment will be omitted since it is identical to the polymeric material coating step S1 according to the former embodiment.

Afterwards, the metal oxide coating step S2 is carried out by coating the polymeric material 20 with a metal oxide 230 which contains light-scattering particles 231. At the metal oxide coating step S2, the metal oxide 230 is mixed with the light-scattering particles 231, the refractive index of which differs from that of the metal oxide 230, and then the polymeric material 20 is coated with the mixture including the metal oxide 230 and the light-scattering particles 231. For instance, the light-scattering particles 231 can be $SiO_2$, and the metal oxide 230 can be $TiO_2$. The metal oxide 230 that contains the light-scattering particles 231 forms an internal light extraction layer of an organic light-emitting device (200 in FIG. 11), and serves to scatter light that would otherwise be lost in a light waveguide mode, i.e. disturb the light waveguide mode, thereby improving light extraction efficiency.

After that, the frit coating step S3 is carried out by coating the metal oxide 230 with frit paste 30. A description of the frit coating step S3 according to this embodiment will be omitted since it is identical to the frit coating step S2 according to the former embodiment, except for an object that the frit paste coats.

At the metal oxide coating step S2 and the frit coating step S3, it is preferred that the thickness of the frit paste 30 and the thickness of the metal oxide 230 be controlled in consideration of shrinkage during heat treatment such that the thickness of a stack including a frit substrate (110 in FIG. 10) and the metal oxide 230 that is to be formed in the following process ranges from 5 to 20 µm.

Afterwards, as shown in FIG. 10, the heat treatment and separating step S4 includes heat treatment at a temperature where the polymeric material 20 decomposes, whereby the stack including the frit substrate 110 and the metal oxide 230 is separated from the support 10. Here, the frit substrate 110 is made through the heat treatment by which the frit paste 30 is hardened. At the heat treatment and separating step S3, the heat treatment can be carried out at a temperature ranging from 400 to 600° C.

When the heat treatment is carried out at the temperature where the polymeric material 20 decomposes, the polymeric material 20 is removed through the decomposition, whereby the stack including the frit substrate 110 and metal oxide 230 is separated from the support 10. Since the polymeric material 20 forms a highly flat surface when the polymeric material 20 is applied on the support 10, one surface of the stack that has coated the highly flat surface of the polymeric material 20, i.e. the surface of the metal oxide 230 (i.e. the upper or outer surface of the metal oxide 230 when referring to FIG. 10), also forms a highly flat surface. The surface roughness rms of the outer surface of the metal oxide 230 ranges from 0.4 to 5 nm, which is similar or equal to the surface roughness of the polymeric material 20.

The surface roughness of the other surface of the stack, i.e. the surface of the frit substrate 110 (i.e. the lower or outer surface of the frit substrate 110 when referring to in FIG. 10), is higher than the surface roughness of the outer surface of the metal oxide 230.

Afterwards, as shown in FIG. 11, the device layer forming step S5 is carried out by forming the device layer 120 on the one surface of the stack, i.e. the upper surface of the metal oxide 230. The upper surface of the metal oxide 230 is highly flat since it has coated the polymeric material 20. A detailed description of the device layer forming step S5 according to this embodiment will be omitted since it is substantially identical to the device layer forming step S4 according to the former embodiment.

As set forth above, the method of manufacturing an ultrathin organic light-emitting device according to this exemplary embodiment includes the step of forming the metal oxide 230 which forms the internal light extraction layer of the organic light-emitting device 200. Although the thickness of the organic light-emitting device 200 according to this embodiment can be larger than the thickness of the organic light-emitting device (100 in FIG. 6) according to the former embodiment, the organic light-emitting device 200 according to this embodiment is ultrathin compared to a conventional organic light-emitting device. Since the internal light extraction layer composed of the metal oxide 230 in which the light-scattering particles 231 are dispersed is disposed close to the organic light-emitting layer 122, the light extraction efficiency can be further enhanced.

The foregoing descriptions of specific exemplary embodiments of the present invention have been presented with respect to the drawings. They are not intended to be exhaustive or to limit the present invention to the precise forms disclosed, and obviously many modifications and variations are possible for a person having ordinary skill in the art in light of the above teachings.

It is intended therefore that the scope of the present invention not be limited to the foregoing embodiments, but be defined by the Claims appended hereto and their equivalents.

What is claimed is:

1. A method for manufacturing an ultrathin organic light-emitting device, comprising:
   coating a support with a polymeric material;
   forming an overlayer on the polymeric material, forming the overlayer comprising coating the polymeric material with frit paste;
   heat-treating a resultant structure at a temperature where the polymeric material decomposes such that a light extraction substrate formed from the overlayer through the heat treatment is separated from the support, the light extraction substrate comprising a frit substrate formed from the frit paste through the heat treatment; and
   forming a device layer on one surface of the light extraction substrate which has coated the polymeric material, the device layer comprising a first electrode, an organic light-emitting layer and a second electrode which are sequentially disposed on the one surface of the frit substrate.

2. The method according to claim 1, wherein the polymeric material is coated with the frit paste such that a thickness of the frit substrate ranges from 4 to 5 μm.

3. The method according to claim 1, wherein the polymeric material comprises one selected from the group of candidate polymeric materials consisting of polydimethylsiloxane, photoresist and polyimide.

4. The method according to claim 1, wherein the temperature where the resultant structure is heat-treated ranges from 400 to 600° C.

5. The method according to claim 1, wherein, after the light extraction substrate is separated from the support, a surface roughness of the other surface of the light extraction substrate is higher than a surface roughness of the one surface of the light extraction substrate.

6. The method according to claim 5, wherein the surface roughness of the one surface of the light extraction substrate ranges from 0.4 to 0.5 nm.

7. The method according to claim 1, wherein a total of a thickness of the frit substrate and a thickness of the device layer is 10 μm or less.

8. The method according to claim 1, wherein
   forming the overlayer further comprises coating the polymeric material with a metal oxide that contains light-scattering particles therein such that a layer of the metal oxide is disposed between a layer of the polymeric material and a layer of the frit paste; and
   the light extraction substrate further comprises a metal oxide layer formed from the metal oxide through the heat treatment.

9. The method according to claim 8, wherein the polymeric material is coated with the metal oxide and the frit paste such that a thickness of the light extraction substrate ranges from 5 to 20 μm.

10. The method according to claim 8, wherein the polymeric material coating the support comprises one selected from the group of candidate polymeric materials consisting of polydimethylsiloxane, photoresist and polyimide.

11. The method according to claim 8, wherein the temperature where the resultant structure is heat-treated ranges from 400 to 600° C.

12. The method according to claim 8, wherein, after the stack is separated from the support, a surface roughness of the other surface of the light extraction substrate is higher than a surface roughness of the one surface of the light extraction substrate.

13. The method according to claim 12, wherein the surface roughness of the one surface of the light extraction substrate ranges from 0.4 to 0.5 nm.

14. The method according to claim 8, wherein the metal oxide layer is an internal light extraction layer for an organic light-emitting device.

\* \* \* \* \*